United States Patent [19]

Gourrier et al.

[11] Patent Number: 4,645,683
[45] Date of Patent: Feb. 24, 1987

[54] METHOD OF MANUFACTURING A SEMICONDUCTOR DEVICE

[75] Inventors: Serge Gourrier, Lognes; Jean-Bernard Theeten, Ozoir-la-Ferriere, both of France

[73] Assignee: U.S. Philips Corporation, New York, N.Y.

[21] Appl. No.: 784,011

[22] Filed: Oct. 4, 1985

[30] Foreign Application Priority Data

Oct. 9, 1984 [FR] France .................. 84 15484

[51] Int. Cl.$^4$ .................................. H01L 21/318
[52] U.S. Cl. ............................... 427/38; 156/643; 427/39; 427/82; 427/94
[58] Field of Search ............. 427/39, 94, 82, 38; 156/643

[56] References Cited

U.S. PATENT DOCUMENTS 4,361,461 11/1982 Chang ................... 156/643
4,436,770 3/1984 Nishizawa ............. 427/39
4,455,351 6/1984 Camlibel ............... 427/39

OTHER PUBLICATIONS

Bayraktaroglu et al, "Silicon-Nitride-Gallium Arsenide MIS Structures Produced by Plasma Enhanced Deposition", J. Appl. Phys. 52(5), May 1981.
Clark et al "Improvements in GaAs/Plasma-Deposited Silicon Nitride . . . " J. Vac. Sci. Technol. 21(2), Jul.-/Aug. 1982, pp. 453–457.

Primary Examiner—John D. Smith
Attorney, Agent, or Firm—Paul R. Miller

[57] ABSTRACT

A method of manufacturing a semiconductor device is provided in which a surface of a substrate containing gallium and arsenic is treated in a first plasma containing hydrogen, and then, is coated with a layer of silicon nitride in a second plasma containing silicon and nitrogen. According to the invention, arsenic is added to the first plasma in the form of arsine. Further, the substrate is heated to a temperature below 450° C. during such treatment. After this treatment, but before the coating, the substrate is superficially converted into a surface layer of gallium and arsenic nitrides in a third plasma containing nitrogen. In this way, an almost ideal passivation of the surface of a gallium and arsenic containing substrate can be obtained.

12 Claims, 9 Drawing Figures

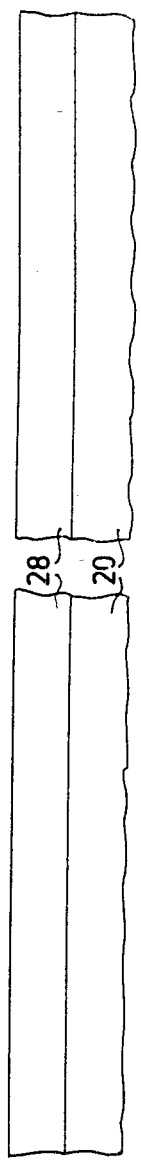
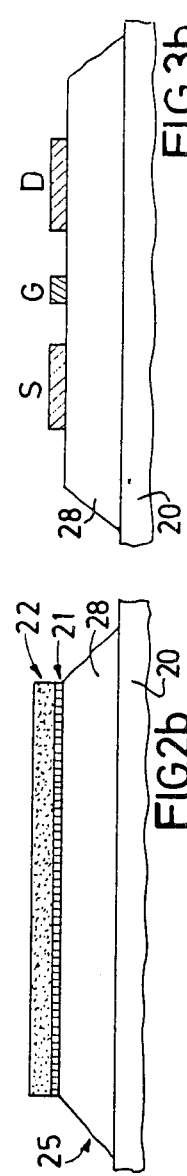
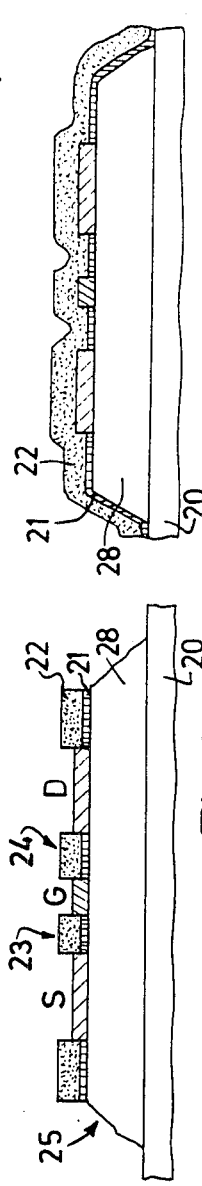
FIG.3a  FIG.3b  FIG.3c  FIG.3d
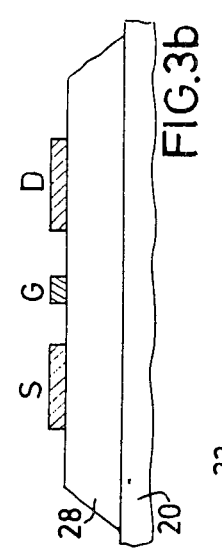
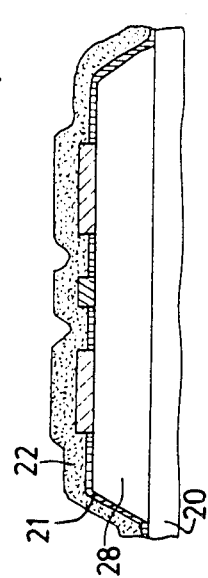
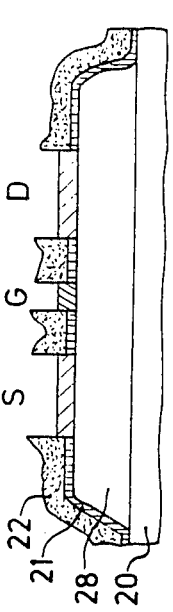
FIG.2a  FIG.2b  FIG.2c

METHOD OF MANUFACTURING A SEMICONDUCTOR DEVICE

The invention relates to a method of manufacturing a semiconductor device, in which method a surface of a gallium and arsenic containing substrate is treated in a first plasma containing hydrogen and then is coated with a layer of silicon nitride in a second plasma containing silicon and nitrogen.

Such a method is known from "Improvements in GaAs/plasma deposited silicon nitride interface quality by predeposition GaAs surface treatment and postdeposition annealing", Marion D. Clark and C. Lawrence Anderson in J. Vac. Sci. Technol. 21 (2) July/August 1982. This article discloses a method of improving the quality of the deposition of silicon nitride layers ($Si_3N_4$) on a substrate of monocrystalline gallium arsenide polished beforehand. The improvement of the interface between GaAs and $Si_3N_4$ is obtained by a plasma treatment of the gallium arsenide substrate before the deposition of the nitride layer. This plasma treatment consists of a first step during which a nitrogen plasma serves to outgas the walls of the reactor and a second step during which a hydrogen plasma serves to reduce the native oxides at the surface of gallium arsenide. The silicon nitride layer is then deposited by a plasma of silane and nitrogen ($SiH_4+N_2$). The deposition is followed by a sintering treatment at a temperature of up to 600° C.

However, when used for the manufacture of active elements, such as field effect transistors or diodes this known method has disadvantages.

First, the treatment of a gallium and arsenic containing substrate by a hydrogen plasma leads to the formation of volatile hydrides and depletes the surface of arsenic. This effect is known for example from U.S. Pat. No. 4,361,461, column 4. The depletion of arsenic is, for example, of the order of 3 to 8% for gallium arsenide. Thus the stoichiometric composition of the compound and consequently the electrical properties of an active device processed from its surface may not come up to expectations.

Further, the object of the treatment, which is the elimination of the undesired oxides, is not achieved entirely, as is shown in FIGS. 5 and 6 of the aforementioned publication of M. D. Clark and C. L. Anderson.

Moreover, the sintering treatment at 600° C. plays an important part in obtaining improvement of the quality of the interface between the semiconductor and nitride layer. (See FIG. 3 of the document just mentioned.) Because such a high temperature must absolutely be avoided during processing of active elements due to the fact that the arsenic contained in the substrate becomes volatile from 450° C., this method cannot be utilized for obtaining a passivation layer for an active device.

The present invention has for its object to provide a method of manufacturing a semiconductor device, avoiding these disadvantages.

According to the invention, this is achieved by means of a method of the kind defined in the opening paragraph which is characterized in that (a) arsenic is added to the first plasma, (b) during the treatment in the first plasma the substrate is heated at a temperature below 450° C. and (c) after this treatment but before coating with the layer of silicon nitride the substrate is superficially converted into a surface layer of gallium- and arsenic nitrides in a third plasma containing nitrogen.

Due to the addition of arsenic to the first plasma the oxide layer present at the surface of the material can be removed entirely without an undesired depletion of arsenic occurring. The impurities different from oxygen are also removed. The surface can be considered to be absolutely clean without being adversely affected. The surface layer of gallium- and arsenic nitrides constitutes in itself the passivation with the silicon nitride layer then serving either as a dielectric or as a mechanical protection.

In a preferred embodiment of the invention, this method is characterized in that, the substrate consists of gallium arsenide (GaAs), the first plasma is excited in a mixture of hydrogen and arsine ($H_2+AsH_3$), in which the quantity of arsine is smaller than or of the order of 1% by volume and that the substrate is heated to a temperature of about 370° C.

In order that the invention may be readily carried out, it will now be described more fully with reference to the accompanying drawing, in which:

FIG. 1 shows the equipment by which the method according to the invention can be carried out;

FIGS. 2a, 2b, and 2c show the different stages of the manufacture of an active semiconductor element in the case in which the method according to the invention is effected at the beginning of the processing;

FIGS. 3a, 3b, 3c and 3d show the different stages of the manufacture of an active element in the case in which the method according to the invention is carried out at the end of the processing;

Figure 1:
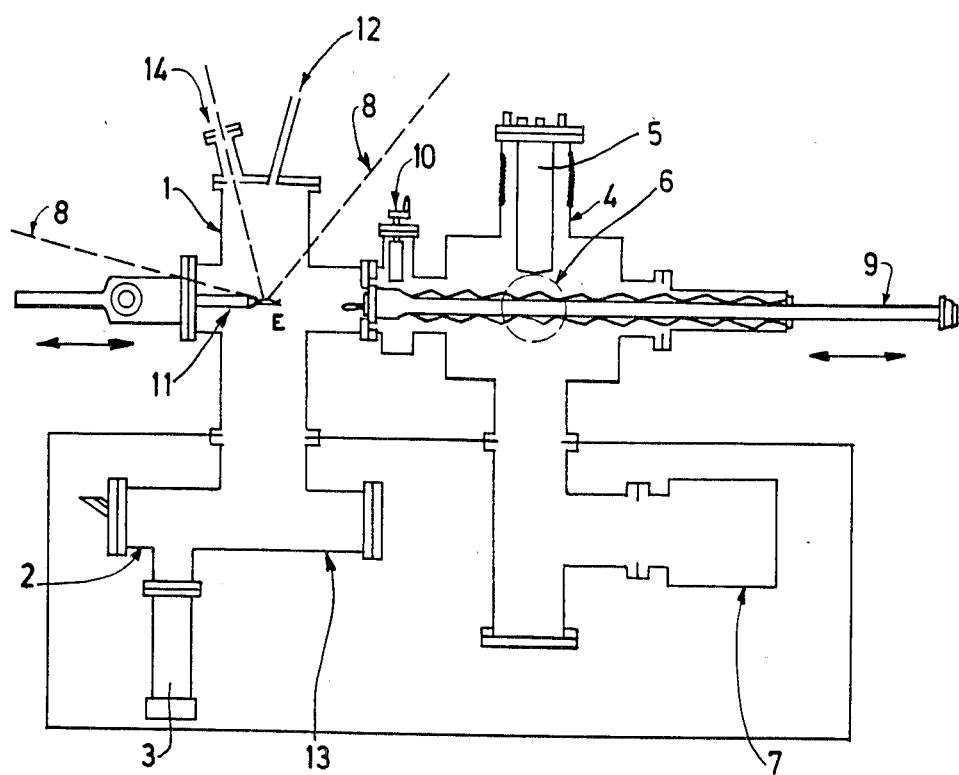

As shown in FIG. 1, the equipment used for carrying out the method according to the invention first comprises a treatment chamber 1 which can be brought to a vacuum of about $10^{-9}$ torr by a diffusion pump 3 and a turbomolecular pump 13 and ultravacuum trap 2. Two openings provided in the treatment chamber permit carrying out ellipsometric measurements on the sample E when it is in its place with the light beams being represented by dotted lines 8. This equipment further comprises a characterization chamber 4 which permits to measurements to be carried out by a Rheed gun 6 and an Auger spectrometer 5. The system for transferring the sample from the treatment chamber to the characterization chamber comprises a transfer tube 9, a rotation-translation system 10 and a sample support 11. The characterization chamber is provided with an ion pump 7. The two chambers can be caused to communicate by opening a cock. A Langmuir probe (not shown) is associated with the treatment chamber.

The gases enter the treatment chamber at 12 and the sample can be heated by the Joule effect. A pyrometer 14 permits of measuring the temperature thereof.

Ellipsometric kinetic measurements permit characterizing the sample during deposition.

Ellipsometric spectroscopic measurements permit determining parameters in the rest condition parameters, such as the dielectric constants and the thickness of the insulator.

The diffraction by high-energy electrons with a Rheed gun supplies information about the crystalline structure of the surface of the sample.

The Auger spectroscopy supplies information about the chemical composition of the surface.

The mass spectroscopy indicates the composition of the plasma.

The Langmuir probe provides accurately the different physical properties thereof.

Such equipment permits preparing and characterizing samples of III-V material intended for the manufacture of semiconductor devices.

Before any manufacture of semiconductor devices, and more particularly of devices including a III-V material, the substrate has to be subjected to a preparation. In fact the publications edited hitherto about this subject matter, for example the publication previously mentioned, or the publication of Burhan Bayraktaroglu and Robert L. Johnson in J. Appl. Phys. 52 (5), May 1981, entitled "Silicon-nitride-gallium-arsenide MIS structures produced by plasma enhanced deposition", clearly show that the native oxide on the surface of the III-V materials including arsenic and gallium has numerous disadvantages, especially a high leakage current in the transistors and a low capacitance modulation in the MIS structure. The semiconductor devices therefore must always be manufactured on a surface which has been subjected to a precleaning treatment and has than been coated with a so-called passivation layer.

Hitherto, the optimum results for removing the original oxide had been obtained by the effect of a plasma of hydrogen ($H_2$). However, the aforementioned publications illustrate that in analysis of an Auger spectrometer a high oxygen level still remains.

The measurements carried out by the equipment described above during the investigations leading to the present invention have shown that only arsenic oxide is removed by the plasma of hydrogen.

Gallium oxide is not removed and moreover the chemical composition of the surface is depleted of arsenic in quantities that may be up to 8%, as a result of which the electrical properties expected for an active element manufactured with the material thus prepared may change considerably.

According to the invention, a quantity of arsine ($AsH_3$) of the order of 0.3% of the hydrogen is added to the latter during the treatment of a surface of, for example, gallium arsenide. The measurements by an Auger spectrometer show that on the one hand gallium oxide is then reduced and that on the other hand the stoichiometric composition of the gallium arsenide at the surface is restored. Moreover, impurities, such as carbon, are removed.

The surface can then be considered to be absolutely clean.

However, a subsequent contamination of the surface thus prepared has then to be avoided.

For this purpose, according to the prior art passivation by a layer of silicon nitride has been proposed. However, the publication of D. Clark and C. L. Anderson shows that the silicon nitride layer itself contains oxygen.

Therefore, according to the present invention a protective thin layer containing arsenic- and gallium nitrides is manufactured in a simple manner by a plasma of nitrogen ($N_2$) immediately after the cleaning treatment. A layer of the order of $2 \times 10^{-3}$ μm is sufficient to ensure the true passivation of surface.

The silicon nitride layer is then formed only as a mechanical or electrical protection or as a dielectric.

The great advantage of the method according to the invention is that all operations can be carried out by means of a plasma in the same space without removing the sample from that space.

The following examples show that the disadvantages mentioned before are avoided: namely, the leakage current in an active device is reduced; the electrical properties are maintained; and all results are reproducible.

EXAMPLE I

The sample is a monocrystalline of n-type gallium arsenide (doping level $\simeq 10^{18}$ cm$^{-3}$).

After having been introduced into the treatment chamber of the equipment, it is characterized by Auger spectroscopy and by spectroscopic ellipsometry. The measurements show the presence of a thin layer of native oxide and a carbon contamination.

The sample is then subjected to a multipolar plasma of a mixture of hydrogen and arsine in the following experimental conditions:

overall pressure $\simeq 10^{-3}$ torr;
ratio between the partial arsine pressure ($AsH_3$) and the overall pressure about 3%/oo;
temperature of the sample about 380° C.;
density of the plasma of the order of $10^{10}$ cm$^{-3}$.

The action of the plasma on the sample is followed by ellipsometry. It proceeds in two stages. The first stage is the removal of the carbon contamination and arsenic oxide. The second stage is the reduction of gallium oxide.

The analysis by means of an Auger spectrometer then permits controlling the complete absence of oxygen at the surface of the sample at this stage.

The sample is then subjected to the effect of a plasma of nitrogen in the following experimental conditions:

overall pressure $\simeq 10^{-3}$ torr;
ambient temperature;
density of the plasma $\simeq 10^{10}$ cm$^{-3}$.

The ellipsometric control then shows the formation of a thin layer (1.5 to 2 nm) of dielectric. Analysis by photoemission show that this layer is formed from the mixture of arsenic and gallium nitrides.

The sample is then coated with a layer of about 0.1 μm of silicon nitride obtained by deposition from the vapour phase assisted by plasma in the same chamber in the following experimental conditions:

mixture of silane plus nitrogen ($SiH_4 + N_2$);
ratio between the flows of nitrogen with respect to the silane $\simeq 25$;
ambient temperature;
rate of deposition $2.10^{-3}$ μm/minute.

The sample then can be removed from the treatment chamber of the equipment and be characterized as follows:

the photoluminescence efficiency of the surface treatment by plasma ($AsH_3 + H_2$) according to the method described is about three times higher than if the sample had been subjected only to a treatment by plasma of hydrogen alone ($H_2$). This corresponds to a recombination rate about ten times lower and clearly shows the importance of the addition of arsine to the plasma used for the treatment.

MIS (metal—insulator—semiconductor) structures have been formed on samples treated according to the method described above. The analysis of the electrical properties, such as:

the capacitance as a function of the applied voltage; and the conductance as a function of the applied voltage, has shown that the spread of the density of surface states permits a stronger modulation of the Fermi level (0.8 to 1 eV) than in MIS structures not treated by means of the method according to the invention (about 0.4 eV in this case).

EXAMPLE II (cf. FIG. 2).

The sample is a monocrystalline substrate 20 of semi-insulating gallium arsenide which has been subjected to an implantation of silicon ions and has been sintered so that an active layer 28 having a doping of $2.8 \times 10^{17}$ cm$^{-3}$ over about 0.25 $\mu$m has formed (FIG. 2a).

The sample is then treated according to the method described in Example I. Subsequently, the sample coated with arsenic gallium nitride 21 and with silicon nitride 22 (FIG. 2b) is introduced into a cycle of technological operations, which permits obtaining field effect transistors, whose main states are:

exposure in the dielectric (nitride 21 and 22) of zones permitting etching into the active layer and thus insulating each device by formation of mesas 25;

exposure in the dielectric on each mesa zones for the ohmic source and drain contacts S and D, respectively; formation of these contacts by evaporation of gold and of germanium and then formation of the alloy;

exposure in the dielectric of a gate zone G and evaporation in this zone of a suitable metal for forming the gate contact (FIG. 2c), for example, aluminum.

It should be noted that the access zones 23 and 24 of the transistor between the source and the gate on the one hand and between the gate and the drain on the other hand have constantly remained coated with dielectric during the processing of the field effect transistor.

Figure 4:
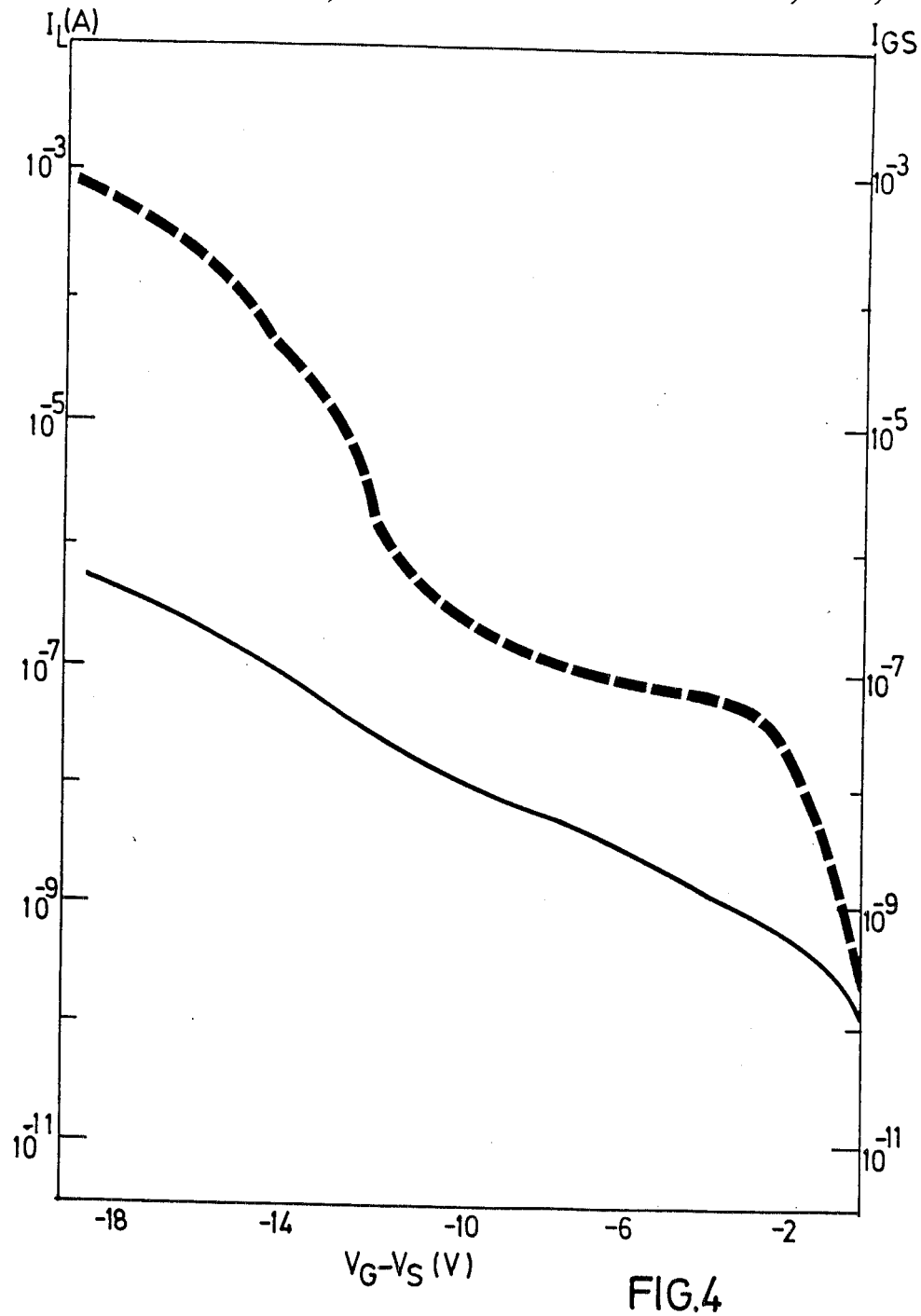
FIG. 4 shows the variations of the intensity of the leakage current (in amperes) as a function of the voltage difference between gate and source (in volts) in a field effect transistor obtained by means of the method according to the invention as compared with these variations observed in a non-treated transistor.

The dielectrical properties of this transistor have then been measured. This transistor has a leakage current represented by full lines in FIG. 4 between the gate and the source, the source and the drain being shortcircuited just below the leakage current represented by dotted lines in the same FIG. 4 of a similar transistor obtained by a method according to the prior art. The transistor according to the invention further exhibits a total absence of dispersion of the transconductance.

The properties of the low-noise field effect transistors of gallium arsenide considered were:

gate length: 2 $\mu$m
gate width: 30 $\mu$m.

EXAMPLE III (cf. FIG. 3).

The treatment described in Example I is applied in this case to power field effect transistors of gallium arsenide at the end of the manufacturing technology.

In this case, in fact after the manufacture on a monocrystalline semi-insulating substrate of gallium arsenide 20 of an active layer 28 and of mesas 25 (FIG. 3a), the source, gate and drain contacts, S, G and D, respectively, are formed directly with the source-drain access zones 23 and the gate-drain access zone 24 being bare (FIG. 3b).

The treatment according to the invention is then effected in this state (FIG. 3c). The deposition of silicon nitride is effected on the assembly of the transistor, and a supplementary stage of exposing the dielectric in the electrical contact zones has then to be added (FIG. 3d).

Before the application of the method according to the invention to such a transistor, the latter had a fairly frequently occurring anomaly designated as "commutation to two times", which consists in that:

the transistor passes from the cut-off state to the conductive state in two stages. It has been found that this phenomenon disappeared by the application of the method to this transistor.

On the other hand, also in this case, the treatment according to the invention reduces the leakage currents by a factor of two at low field strength and by a factor of eight at high field strength with the gate-source voltage being about 20 V and with the source and the drain being interconnected. This result is of particular importance for a power transistor.

It will be appreciated that the method according to the invention can be applied to numerous other devices without departing from the scope of the invention as defined by the appended claims.

What is claimed is:

1. A method of manufacturing a semiconductor device in which method a surface of a gallium and arsenic containing substrate is treated in a first plasma containing hydrogen and then is coated with a layer of silicon nitride in a second plasma containing silicon and nitrogen, characterized in that,
    (a) arsenic is added to the first plasma,
    (b) during the treatment in the first plasma the substrate is heated at a temperature below 450° C. and
    (c) after this treatment but before the coating with the layer of silicon nitride the substrate is superficially converted into a surface layer of gallium- and arsenic nitrides in a third plasma containing nitrogen.

2. Method as claimed in claim 1, characterized in that the substrate consists of gallium arsenide.

3. Method as claimed in claim 1 or 2, characterized in that arsenic is added to the first plasma in the form of arsine (AsH$_3$) in a quantity of 1% by volume at most and that the substrate is heated at a temperature of about 370° C.

4. Method as claimed in claim 3, characterized in that the surface layer of gallium- and arsenic nitrides is obtained over a thickness of about 2 nm.

5. Method as claimed in claim 4, characterized in that the second plasma is excited in a gas containing silane and nitrogen (SiH$_4$ and N$_2$).

6. Method as claimed in claim 5, characterized in that the first, second and third plasma are excited in the same space.

7. Method as claimed in claim 4, characterized in that the first, second and third plasma are excited in the same space.

8. Method as claimed in claim 3, characterized in that the first, second and third plasma are excited in the same space.

9. Method as claimed in claim 3, characterized in that the second plasma is excited in a gas containing silane (SiH$_4$) and nitrogen (N$_2$).

10. Method as claimed in claim 1 or 2, characterized in that the surface layer of gallium and arsenic nitrides is obtained over a thickness of about 2 nm.

11. Method as claimed in claim 1 or 2, characterized in that the second plasma is excited in a gas containing silane (SiH$_4$) and nitrogen (N$_2$).

12. Method as claimed in claim 1 or 2, characterized in that the first, second and third plasma are excited in the same space.

* * * * *